United States Patent [19]

Ritt et al.

[11] Patent Number: 4,561,931

[45] Date of Patent: Dec. 31, 1985

[54] METHOD INCLUDING PRODUCING A STENCIL FROM LAYER OF DICHROMATE-SENSITIZED PVA AND FLUORESCEIN-TYPE DYE

[75] Inventors: Peter M. Ritt, West Lampeter Township, Lancaster County; Mary L. Saulnier-Ebert, Upper Leacock Township, Lancaster County, both of Pa.

[73] Assignee: RCA Corporation, Princeton, N.J.

[21] Appl. No.: 685,065

[22] Filed: Dec. 21, 1984

[51] Int. Cl.[4] ............................. C23F 1/02; B44C 1/22; C03C 15/00; C03C 25/06
[52] U.S. Cl. .................................... 156/640; 156/644; 156/659.1; 156/661.1; 156/904; 430/28; 430/270; 430/325
[58] Field of Search ............ 156/640, 644, 654, 659.1, 156/661.1, 904; 430/5, 23, 25, 28, 270, 274, 325, 909, 915

[56] References Cited

U.S. PATENT DOCUMENTS

| | | | |
|---|---|---|---|
| 3,074,794 | 1/1963 | Oster | 430/270 |
| 4,255,504 | 3/1981 | Hakala | 430/28 |
| 4,339,528 | 7/1982 | Goldman | 430/323 |
| 4,339,529 | 7/1982 | Goldman | 430/323 |
| 4,401,508 | 8/1983 | Ritt | 156/659.1 |

Primary Examiner—William A. Powell
Attorney, Agent, or Firm—Eugene M. Whitacre; Dennis H. Irlbeck; LeRoy Greenspan

[57] ABSTRACT

A method for producing a stencil of PVA (polyvinyl alcohol) including applying and heat-drying to a surface a coating of an aqueous composition of PVA and dichromate sensitizer, and then exposing and developing the dried coating. The aqueous composition includes a fluorescein-type dye or combination of dyes in such proportions as to substantially reduce heat-hardening of the dried coating. The method is particularly useful for preparing etch-resistant stencils used in preparing precision-etched products, such as apertured masks for use in cathode-ray tubes.

18 Claims, 1 Drawing Figure

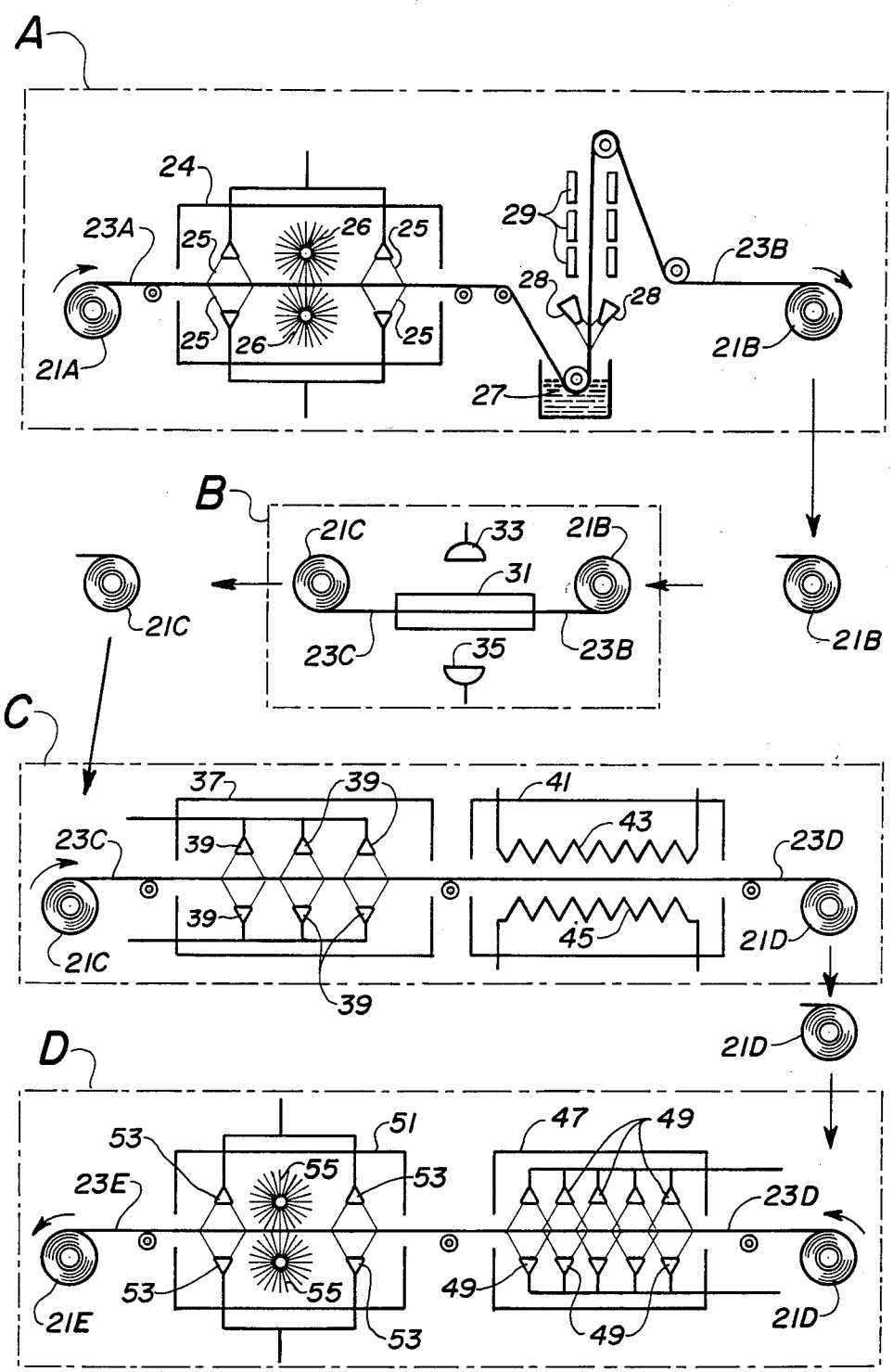

METHOD INCLUDING PRODUCING A STENCIL FROM LAYER OF DICHROMATE-SENSITIZED PVA AND FLUORESCEIN-TYPE DYE

BACKGROUND OF THE DISCLOSURE

This invention relates to a method including producing, on the surface of a substrate, a stencil from a photosensitive layer comprising a dichromate-sensitized PVA (polyvinyl alcohol) and fluorescein-type dye. The method may be included in a method for etching flat apertured masks for use in color television picture tubes and for etching other precision-etched products.

The preparation of flat apertured masks by etching a stencilled metal sheet has been described previously; for example, in U.S. Pat. Nos. 4,061,529 issued Dec. 6, 1977 to A. Goldman, 4,126,510 issued Nov. 21, 1978 to J. J. Moscony et al., and 4,389,279 issued June 21, 1983 to D. M. Weber et al. In a typical industrial process for producing apertured masks, a substrate in the form of a thin metal sheet of cold-rolled steel, for example, is coated on both major surfaces with a liquid composition of a binder, a dichromate photosensitizer for the binder and water. The coatings are heated at temperatures in the range of about 120° to 200° C. to produce dry photosensitive coatings. After a storage period, the coatings are exposed to light images of actinic radiation whereby the exposed portions of the coatings harden; that is, become substantially insoluble, in water. The exposed coatings are sprayed with water whereby the still-soluble portions of the coatings are removed leaving the insolubilized portions in place, thereby producing stencils on the surfaces. The stencils are baked at temperatures in the range of about 200° to 400° C. to improve their resistance to attack by the acid etchant. Then, the metal sheet is etched through the stencils to produce the desired flat masks. The stencils are removed from the etched sheet, and then the flat masks are cut or torn from the sheet.

A number of special problems arise when dichromated PVA is used as the photosensitive coating. During the initial drying step, the photosensitive coatings are more or less insolubilized by action of the heat used for drying. This "heat-hardening" effect varies and is difficult to control. Also, during the storage periods before and after exposure to light images, the photosensitive coatings more or less insolubilize without light or heat being applied. This "dark-hardening" effect varies and also is difficult to control. The effect of heat-hardening and dark-hardening can be reduced by reducing the concentrations of dichromate sensitizer in the coatings, but this reduction also reduces the photosensitivities of the coatings, and reduces the resistance to attack by the acid etchant of the stencils produced therefrom.

Another problem, which occurs after etching the sheet, is the incomplete removal of the PVA stencils from the etched sheet. None of the expedients suggested in U.S. Pat. Nos. 4,208,242 issued June 17, 1980 to P. Zampiello, 4,339,528 and 4,339,529 both issued on July 18, 1982 to A. Goldman and 4,401,508 issued Aug. 30, 1983 to P. M. Ritt have proven to be adequate for industrial use.

SUMMARY OF THE INVENTION

The novel method is similar to the prior methods mentioned above except that the substrate is coated with an aqueous composition comprising PVA solids, a dichromate sensitizer therefor and a fluorescein-type dye or a combination of such dyes, in such proportion with respect to the content of the dichromate sensitizer as to substantially reduce the heat-hardening during the subsequent drying step. Concentrations of 1 to 20 weight percent of dye with respect to the weight of the dichromate sensitizer are preferred, and sodium fluorescein is the preferred dye.

By employing the fluorescein-type dye as described above, "heat-hardening" during drying of the coating is substantially reduced so that practical rapid drying at higher temperatures can be realized. Also, the above-described use of fluorescein-type dye substantially reduces the dark-hardening of the photosensitive coating that ordinarily occurs during storage before exposure, permitting longer storage periods to be used. Concentrations of dichromate in the coating can be maintained permitting photosensitivity of the coating to be maintained. Furthermore, the above-described use of fluorescein-type dye allows the baked acid-resistant stencil to be removed more easily from the substrate after etching using the usual caustic solution.

BRIEF DESCRIPTION OF THE DRAWING

The sole FIGURE is a flow sheet diagram showing symbolically steps in the method for making flat apertured masks for use in color television picture tubes.

DETAILED DESCRIPTION OF THE PREFERRED EMBODIMENT

The novel method is described below as part of a wet chemical etching process for fabricating apertured masks for use in color television picture tubes. However, the novel method may be used in other wet chemical etching processes for making precision-etched products wherein stencils of heat-hardened PVA are used.

The sole FIGURE illustrates the processing of a roll or strip of sheet metal about 4 to 10 mils thick. The sheet metal may be of regular-carbon steel, or low-carbon steel, or of invar alloy, or of copper nickel alloy, or of other metal or metal alloy. In a preferred embodiment, a roll of low-carbon cold-rolled steel sheet about 6 mils thick is used.

A roll 21A is mounted on a sensitizing machine A where it is unrolled continuously, and a sheet 23A from the roll 21A is passed horizontally through a washer 24 where sprays 25 of an aqueous caustic solution and the action of brushes 26 remove oil, dirt and other foreign material from both major surfaces of the sheet 23A. The major surfaces of the sheet 23A are dried with heat.

The washed sheet 23A is then dipped into a bath 27 of an aqueous composition consisting essentially of PVA, dichromate sensitizer, fluorescein-type dye and water, using one of the formulations given below. After passing out of the bath 27, a wet coating resides on both major surfaces of the sheet 23A. The sheet 23A then passes upwards, and additional aqueous composition is applied to both surfaces with numerous small-diameter nozzles 28. The sheet 23A continues to pass upwards where the coatings are dried at about 120° to 200° C. to nontackiness in about 2 to 10 minutes with the aid of infrared heaters 29, thereby producing a sensitized sheet 23B. A preferred temperature is about 165° C. to realize adequate drying in about 2 minutes. The sensitized sheet 23B then descends, cooling as it descends, and is rolled into a sensitized roll 21B. The dried photosensitive coatings are preferably about 2 to 3 microns thick. The presence of the fluorescein-type dye in the coatings substantially reduces heat-hardening in the coatings during their transit through the heating tower until they cool to room temperature in the roll 21B. This allows shorter drying times at higher temperatures to be used.

The sensitized roll 21B is removed from the sensitizing machine A and stored for about 12 to 20 hours. Then, the sensitized roll 21B is mounted on an exposure apparatus B which includes a vacuum chase 31. The sensitized sheet 23B is unrolled stepwise from the sensitized roll 21B with the sensitized sheet 23B oriented vertically and passes into the chase 31 where the photosensitive coatings thereon are exposed stepwise to actinic radiation from light sources 33, such as 8KW pulsed xenon lamps, through photographic masters in the chase 31. The radiation hardens (insolubilizes) the coatings where the masters permit passage of radiation therethrough. The presence of fluorescein-type dye in the coatings reduces the time necessary for the desired hardening. The exposed sheet 23C with the exposed coatings thereon is then rolled into an exposed roll 21C. The exposed roll 21C is removed from the exposure apparatus B and stored for about 12 to 20 hours. The presence of the fluorescein-type dye in the coatings substantially reduces dark hardening in the coatings during transit through the exposure apparatus and during the storage periods before and after that transit. This allows the exposed roll to be stored for more than a week before excessive fogging due to dark hardening will cause the roll to be rejected. With no dye present, an exposed roll will be rejected for excessive dark hardening after less than 48 hours.

The exposed roll 21C is mounted on a developing machine C where the exposed sheet 23C is unrolled continuously with the sheet 23C oriented either horizontally or vertically. The sheet 23C passes into a developing chamber 37 where both major surfaces are exposed to sprays of water or other aqueous developing solution from nozzles 39 until the coating portions not hardened by actinic radiation are washed away, leaving light-hardened stencils on both surfaces of the sheet. Sprays of water at about 5 psi at about 40° to 70°, preferably about 60° C., for about 2 minutes have been found to be adequate.

The developed sheet now passes through an oven 41 where the stencils are heated with infrared heat from heaters 43 at about 200° to 400° C., preferably at about 250° to 350° C. for 3 to 10 minutes, and in this embodiment at about 325° C. for about 2.5 minutes. The stencils may not adhere adequately to the sheet during the etching step if the stencils are heated at temperatures less than about 200° C. If the stencils are heated at temperatures above about 400° C., they may be difficult to remove after the etching step. The heating or baking further hardens the stencils, making them more resistant to both the mechanical action and the chemical action that is subsequently applied. The developed sheet 23D is then rolled into a developed roll 21D and removed from the developing machine C.

The developed roll 21D is now mounted on an etching machine D where the developed sheet 23D is unrolled continuously with the sheet 23D oriented either horizontally or vertically. The developed sheet 23D passes into an etching chamber 47 where both sides of the sheet 23D are sprayed with aqueous ferric chloride etching solution from nozzles 49. The etching solution etches the sheet 23D in the areas thereof not covered by the stencils. After the sheet leaves the etching chamber 47, it passes through a stencil-removal chamber 51 where sprays of caustic solutions, typically about 4 weight % sodium hydroxide at about 80° C., are applied to remove the hardened stencils from the etched sheet 23E. The sprays issue from nozzles 53 at about 45 psi for about 3.25 minutes. The sprays of caustic solution may be aided by the mechanical action of brushes 55, although this is optional. The presence of the fluorescein-type dye in the initial coatings reduces the difficulty of removing the heat-hardened stencils with caustic solutions. With no dye present, removal of the heat-hardened stencils requires mechanical action in addition to the caustic spray, and even then some organic residue from the stencils remained.

The etched sheet 23E with the stencils removed then exits from the stencil-removal chamber 51 and then may be wound into an etched roll 21E. Instead of forming a roll 21E, the etched articles may be cut or torn from the etched sheet 21E without a roll being formed.

GENERAL CONSIDERATIONS

In the foregoing embodiment, equipments usually used for the particular process steps may be used with or without modification. Since such equipments are described in detail elsewhere and are publicly known, no further descriptions of the equipments are necessary.

The photosensitive coatings described above are produced by coating the surfaces of interest with liquid compositions containing PVA solids, a dichromate sensitizer therefor, a fluorescein-type dye and water. The PVA solids are generally 87 to 99% hydrolyzed, and introduced in dilute aqueous media having a viscosity of about 20 to 32 centipoises per second at 20° C. The sensitizer may be a water-soluble dichromate or combination of dichromates of sodium, potassium, ammonium or of any other cation or organic radical known to serve in this function. The fluorescein-type dye should be water-soluble and may be one or a combination of such dyes. Some examples of such dyes are fluorescein, sodium fluorescein, eosin, erythrósine, rhodamine A and derivatives of these dyes. The dyes are preferably non-carcinogenic.

Generally the liquid composition is acidic and has a pH in the range of about 4.0 to 6.0. The essential ingredients of the coating composition are present in the following weight percents (wt. %):

PVA solids: 3 to 5 wt. % of the liquid coating composition

Dichromate Sensitizer: 10 to 30 wt. % of the wt. of PVA solids

Fluorescein-Type Dye: 1 to 20 wt. % of the wt. of sensitizer

The following are examples of preferred liquid coating compositions:

EXAMPLE 1

PVA solids (Vinol 523 marketed by Air Products 3.4 wt. % of solution Inc., Allentown Pa.):

Ammonium Dichromate Sensitizer: 22.0 wt. % of PVA solids

Sodium Fluorescein (Uranine marketed by Fisher Scientific Co., Fair Lawn, N.J.): 15.0 wt. % of sensitizer

EXAMPLE 2

PVA solids (Vinol 325 marketed by Air Products Inc.): 3.4 wt. % of solution

Ammonium Dichromate Sensitizer: 22.0 wt. % of PVA solids

Sodium Fluorescein: 15.0 wt. % of sensitizer

EXAMPLE 3

PVA Solids (Vinol 325): 3.4 wt. % of solution
Sodium Dichromate Sensitizer: 22.0 wt. % of PVA solids
Sodium Fluorescein: 15.0 wt. % of sensitizer

What is claimed is:
1. In a method for producing a stencil on the surface of a substrate including the steps of
   (a) applying to said surface a coating of an aqueous composition comprising polyvinyl alcohol solids and a dichromate sensitizer therefor,
   (b) heating said coating to produce a dry photosensitive coating on said substrate, said heating causing heat hardening of said dry coating,
   (c) exposing said dry coating to an image of actinic radiation to render irradiated portions of said dry coating substantially insoluble in water, and
   (d) developing said exposed coating by removing the portions of said coating that are not substantially insoluble in water, thereby producing a stencil on said surface,
   the use in said aqueous composition of a fluorescein-type dye or combination of dyes in such proportions with respect to the content of said dichromate sensitizer as to substantially reduce said heat-hardening of said dry coating during step (b).
2. The method defined in claim 1 wherein, in said aqueous composition, the concentration of said dichromate sensitizer is about 10 to 30 weight percent of the weight of said polyvinyl alcohol solids, and the concentration of said dye or dyes is about 1 to 20 weight percent of the weight of said dichromate sensitizer.
3. The method defined in claim 1 wherein, in said aqueous composition, the concentration of said dichromate sensitizer is about 22 weight percent of the weight of said polyvinyl vinyl alcohol solids, and the concentration of said dye or dyes is about 15 weight percent of the weight of said dichromate sensitizer.
4. The method defined in claim 1 wherein, at step (b), said coating is heated in the temperature range of about 120° to 200° C.
5. The method defined in claim 1 including, prior to step (d), the additional step of storing said dry coated substrate for a period of time up to a week whereby, due to the presence of said dye or dyes, dark hardening of said coating is substantially reduced.
6. The method defined in claim 1 wherein said dye or dyes are selected from the group of dyes consisting of fluorescein, fluorescein salts, eosine, erythrosine, rhodamine A, and derivatives of these dyes.
7. The method defined in claim 6 wherein said composition contains a single dye.
8. The method defined in claim 2 wherein said composition contains sodium fluorescein as the sole dye that is present.
9. The method defined in claim 1 including, after step (d), the steps comprising
   (e) baking said stencil at temperatures and for a time interval sufficient to enhance the resistance of said stencil to attack by etching solution,
   (f) and then removing said baked stencil from said surface whereby, due to the presence of said dye or dyes, said baked stencil is more easily removed with caustic solution.
10. The method defined in claim 9 wherein said baking is conducted at about 250° to 350° C. for about 3 to 10 minutes.
11. The method defined in claim 10 wherein said dye is sodium fluorescein.
12. In a method for producing an apertured mask for a cathode-ray tube, the steps comprising
   (a) applying to each major surface of a metal sheet a coating of a liquid, water-based acidic coating consisting essentially of polyvinyl alcohol solids, alkali dichromate photosensitizer for said polyvinyl alcohol, and an operative proportion of fluorescein-type dye,
   (b) heating said coatings to produce dry photosensitive coatings on said sheet, whereby the presence of said dye in said dry coatings is operative to substantially reduce the heat-hardening of said coating,
   (c) exposing said dry coatings to images of actinic radiation to selectively insolubilize irradiated portions of said dry coatings,
   (d) selectively retaining said insolubilized portions of said dry coatings while removing the remainder of said coatings, thereby producing a stencil on each of said major surfaces,
   (e) heating said stencils to increase the etch-resistance of said stencils,
   (f) and then etching said metal sheet through said stencils.
13. The method defined in claim 12 wherein, at step (a), said acidic coating has a pH in the range of about 4.0 to 6.0.
14. The method defined in claim 12 wherein, at step (b), said coatings are heated at temperatures in the range of about 120° to 200° C.
15. The method defined in claim 12 wherein, at step (e), said stencils are heated at temperatures in the range of about 200° to 400° C.
16. The method defined in claim 12 wherein said dye is sodium fluorescein present in concentrations in the range of about 1 to 20 weight percent of the weight of said dichromate sensitizer.
17. The method defined in claim 16 including, prior to step (d), storing said dry coated sheet for a period of time up to about one week, whereby the presence of said dye in said coatings is operative to substantially reduce the dark hardening of said coatings.
18. The method defined in claim 16 including, after step (f), the further step of removing said stencils from said sheet, comprising applying to said stencils an aqueous caustic solution, whereby the presence of said dye in said coatings is operative to substantially facilitate the essentially complete removal of said coatings from the major surfaces of said metal sheet.

* * * * *